United States Patent [19]
Kim et al.

[11] Patent Number: 6,083,826
[45] Date of Patent: Jul. 4, 2000

[54] METHOD FOR MANUFACTURING SEMICONDUCTOR DEVICE CAPABLE OF IMPROVING PLANARIZATION

[75] Inventors: Chang-Gyu Kim; Seok-Ji Hong, both of Kyunggi-do, Rep. of Korea

[73] Assignee: Samsung Electronics Co., Ltd., Suwon, Rep. of Korea

[21] Appl. No.: 09/140,330

[22] Filed: Aug. 26, 1998

[30] Foreign Application Priority Data

Aug. 28, 1997 [KR] Rep. of Korea .................. 97-42211

[51] Int. Cl.[7] .............................................. H01L 21/4763
[52] U.S. Cl. ............................................ 438/631; 438/626
[58] Field of Search .................................. 438/631, 645, 438/626, 675, 672, 241, 349, 926

[56] References Cited

U.S. PATENT DOCUMENTS

| | | | |
|---|---|---|---|
| 5,313,417 | 5/1994 | Yanagi | 365/52 |
| 5,633,201 | 5/1997 | Choi | 438/620 |

*Primary Examiner*—Richard Elms
*Assistant Examiner*—Adam Pyonin
*Attorney, Agent, or Firm*—Jones Volentine, L.L.P.

[57] ABSTRACT

A method is disclosed for manufacturing a semiconductor device that is capable of minimizing a step difference between DRAM and logic regions of a semiconductor substrate by forming a capacitor in the DRAM cell region and then forming a metal interconnection in the logic region after deposition of a first insulating layer before planarization, the metal interconnection having height similar to the capacitor. Although a second insulating layer is deposited over the substrate, a step between the DRAM cell region and local region can be minimized because of the metal interconnection formed in the logic region. Thus, although only either CMP or etch back process is used, planarization of the second insulating layer is allowed.

9 Claims, 3 Drawing Sheets

METHOD FOR MANUFACTURING SEMICONDUCTOR DEVICE CAPABLE OF IMPROVING PLANARIZATION

FIELD OF THE INVENTION

The present invention relates to a method for manufacturing a semiconductor device having a memory device and a logic device on a same wafer, and more particularly to a method for manufacturing a semiconductor device capable of improving planarization between a memory cell region where a memory device is formed and a logic region where a logic device is formed.

BACKGROUND OF THE INVENTION

With the increase in the degree of integration of semiconductor devices, a technique for the planarization of an insulating layer formed over a semiconductor wafer or substrate is further required to assure the photolithographic process margin and to minimize the length of a metal interconnection. In order to planarize an insulating layer, particularly an interlayer insulating layer, several methods have been used. Some examples include: a method for reflowing a doped glass such as BPSG (Boro-Phospho-Silicate-Glass), a SOG (Spin On Glass) process, an etch back process to be performed after depositing a photoresist on the insulating layer, a CMP (Chemical Mechanical Polishing) process for planarizing a deposited insulating layer, and the like. Of these methods, the CMP process allows low-temperature planarization, which can not be achieved by reflowing process or etch back process. Therefore, the CMP process has come into wide use in substrate planarization.

A conventional method for manufacturing a semiconductor device having a DRAM (Dynamic Random Access Memory) cell region and a logic region will now be described with reference to FIG. 1.

Referring to FIG. 1, a transistor including a gate 12 is first formed over a semiconductor substrate 10, whose device isolation is defined by a field oxide 11. A capacitor 14 is formed in direct contact with the substrate 10, and is insulated from the gate 12 by a sidewall spacer 13a and a capping insulating layer 13b which are formed over or beside the gate 12.

Next, an insulator deposition and CMP process is performed to form a first insulating layer 15 having a planarized surface. After forming a contact hole through the planarized insulating layer 15, a first tungsten plug 16a is formed to fill the contact hole and then a first interconnection 17a is formed in electrical contact with the first tungsten it plug 16a.

Subsequently, the insulator deposition and CMP process and the plug and interconnection forming processes are again performed to form a second tungsten plug 16b through a second insulating layer 18 and to form a second interconnection 17b on the second tungsten plug 16b.

As described immediately above, since the field oxide 11 and the gate 12 are simultaneously formed in the DRAM cell region and the logic region before the formation of the capacitors, a high step between devices is not generated. After the formation of the capacitors, however, since the capacitor 14 is formed in the DRAM cell region only, a step between the DRAM cell region and the logic region is very high. Thus, when the insulating layer 15 is deposited after the formation of the capacitor 15, the above-mentioned CMP process should be performed to obtain a flat surface for the insulating layer 15. This leads to one serious problem in that a dishing phenomenon, which results from the uneven polishing by a polishing pad caused by a pressure difference between a portion of the substrate in direct contact with the polishing pad and the other surfaces of the substrate.

To suppress the dishing phenomenon, two polishing steps are used: an etch back step using a photoresist and a CMP step. First, the etch back process using photoresist is performed to remove a constant amount of the insulating layer in a high step region. Then, the CMP process is performed to planarize an overall surface of the substrate.

However, this method has two disadvantages. One disadvantage is that yield is reduced because of the increased number of steps in substrate planarization. The other disadvantage is that this process generates a large number of particles during the polishing because of the etch back using the photoresist.

SUMMARY OF THE INVENTION

The present invention is intended to solve the problems, and it is the object of the invention to provide a method for manufacturing a semiconductor device which is capable of minimizing a step between the DRAM and logic regions by forming a capacitor in the DRAM cell region and forming a metal interconnection in the logic region, the metal interconnection having height similar to the capacitor.

To attain the object, the method for manufacturing a semiconductor device whose substrate is defined by a DRAM cell region and a logic region, comprises the steps of forming a capacitor over a semiconductor substrate of the semiconductor device in the memory cell region, forming a first insulating layer over the capacitor and the semiconductor substrate, locally planarizing the first insulating layer in the memory cell region, locally planarizing the first insulating layer in the logic region, forming a metal pattern layer in the logic region, the metal pattern layer being formed in contact with the semiconductor substrate and having a height similar to the capacitor, forming a second insulating layer over the semiconductor substrate, the first insulating layer, and the metal pattern layer, and planarizing the second insulating layer.

BRIEF DESCRIPTION OF THE DRAWINGS

This invention may be understood and its objects will become apparent to those skilled in the art with reference to the accompanying drawings as follows.

DETAILED DESCRIPTION OF PREFERRED EMBODIMENTS

The present invention will be described in detail with reference to the accompanying drawings showing a preferred embodiment.

Figure 1:
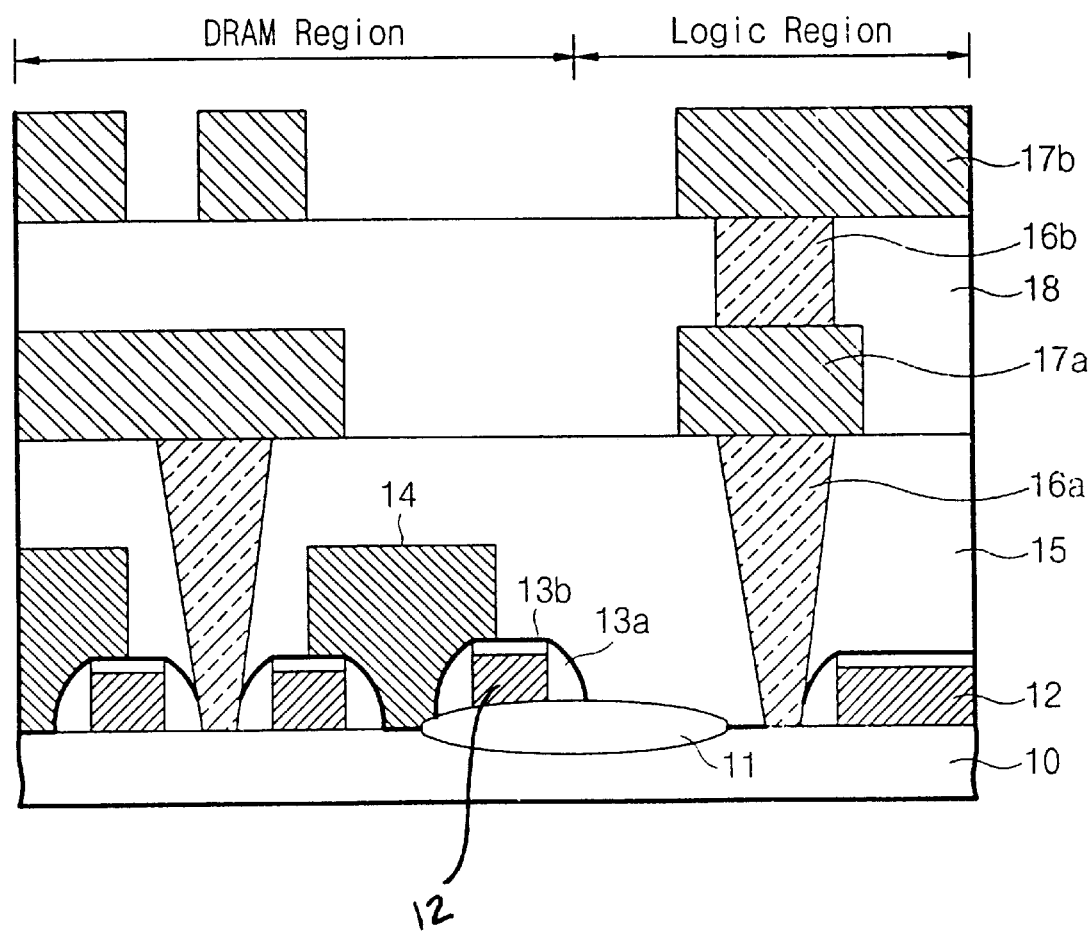
FIG. 1 is a partial cross-sectional view of a conventional semiconductor device whose substrate is defined by a DRAM cell region and a logic region.
Figure 2A:
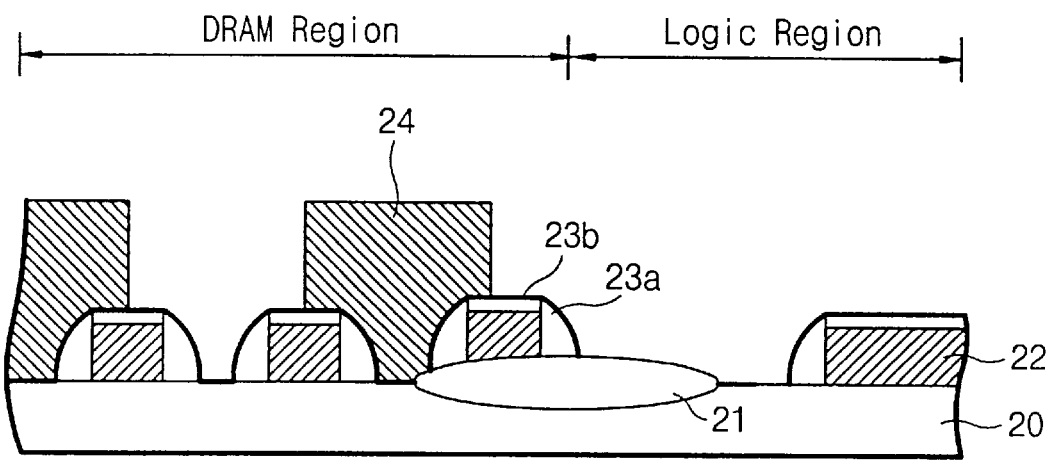
FIGS. 2A through 2D are cross-sectional views showing process steps of a method for manufacturing a semiconductor device according to a preferred embodiment of the present invention.

Referring to FIG. 2A, a semiconductor substrate 20 whose device isolation is defined by a field oxide 21 is divided into DRAM and logic regions. Transistors each including a gate 22 are formed on the semiconductor substrate 20 in the DRAM and logic regions. A capacitor 24 is formed in a DRAM region in direct contact with the substrate 20, and is insulated from the gate 22 by a sidewall spacer 23a and a capping insulating layer 23b which are formed either above or beside the gate 22. It is important to note that the capacitor 24 is formed in the DRAM cell region and not in the logic region, resulting in a high step between the regions.

Figure 2B:
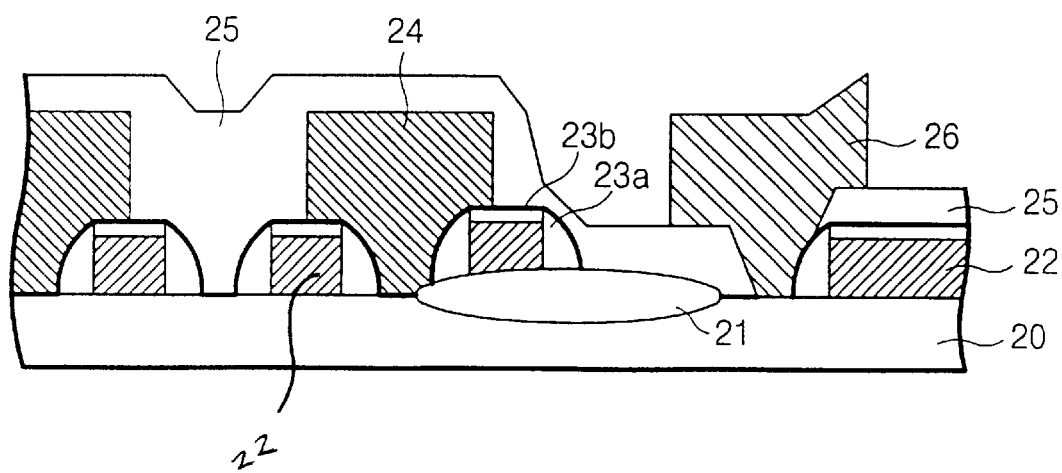

Next, as shown in FIG. 2B, a first insulating layer 25 is formed over the substrate by using an etch back after the deposition of $O_3$-TEOS USG (Undoped Silicate Glass) layer, a SOG etch back, a BPSG reflowing process, or the like. After local planarization of each region, a metal interconnection 26, i.e., a metal pattern having a height similar to the capacitor, is formed in the logic region in contact with the substrate 20 through a contact hole, which is formed in the first insulating layer 25 of the logic region. Planarization between the DRAM and logic regions is not allowed by the first insulating layer 25, but local planarization in the respective regions is allowed.

Formation of the metal pattern 26 can be accomplished by the following steps.

First, a selective etching process is performed on the first insulating layer 25 to form a contact hole. Next, a barrier metal layer, for example, a Ti/TiN layer (not shown) is deposited on the bottom of the contact hole and then an aluminum reflow process is performed. The reflowed aluminum layer is then patterned to form the metal pattern 26. Alternatively, a well-known process for forming a tungsten plug in this art is applicable for formation of the metal pattern 26.

Figure 2C:
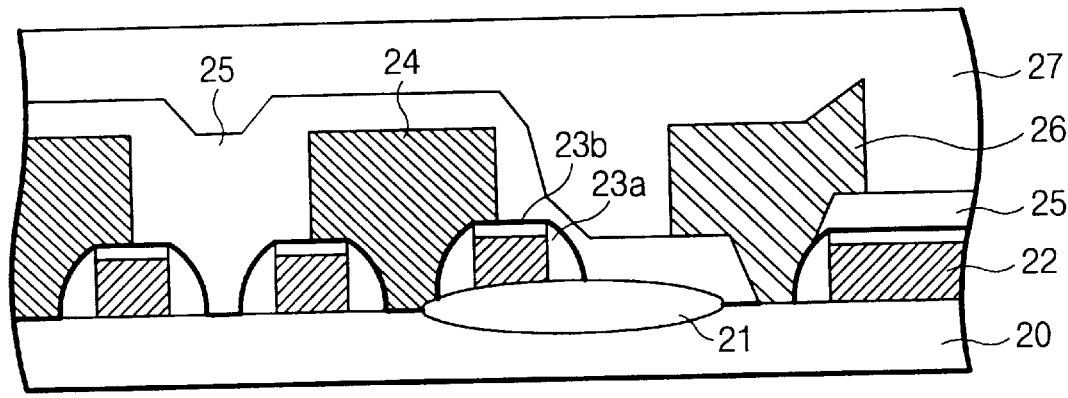

Subsequently, as shown in FIG. 2C, a second insulating layer 27, for example, a SOG layer is formed over the substrate including the metal pattern 26 and the first insulating layer 25, and then a planarization process is performed. The planarization of the second insulating layer 27 can be achieved by only either a CMP or etch back process. When a SOG layer is used as the second insulating layer, the use of etch back is preferable.

Figure 2D:
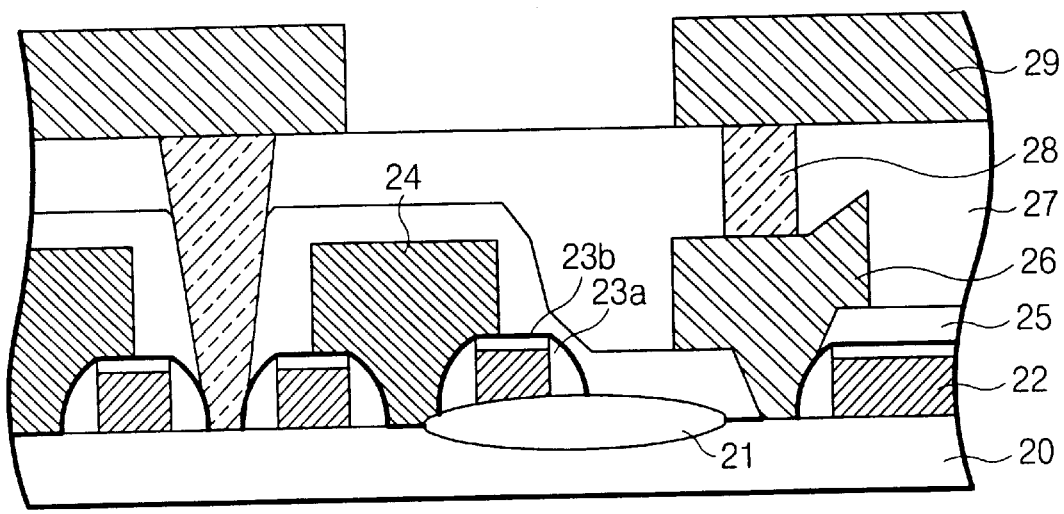

Next, as shown in FIG. 2D, contact holes are formed on the substrate 20 in the DRAM cell region and on the metal pattern 26 in the logic region, and then a conductive material, e.g., tungsten, fills up the contact holes to form a conductive plug 28. Finally, a metal interconnection 29 is formed over the conductive (tunsgten) plug 28. Conductive plugs 28 are simultaneously formed in the DRAM and logic regions.

As described above, although there is, after formation of a capacitor in the DRAM cell region, a high step between DRAM and logic regions of a semiconductor substrate, this step can be minimized by forming a metal pattern in the logic region, wherein the metal pattern has height similar to the capacitor in the logic region and is in direct contact with the substrate. Therefore, a following planarization process of an insulating layer formed over the capacitor and the metal pattern can be simplified.

What is claimed is:

1. A method for manufacturing a semiconductor device having a memory cell region and a logic region, the method comprising the steps of:

forming a capacitor over a semiconductor substrate of the semiconductor device in the memory cell region;

forming a first insulating layer over the capacitor and the semiconductor substrate;

locally planarizing the first insulating layer in the memory cell region;

locally planarizing the first insulating layer in the logic region;

forming a metal pattern layer in the logic region, the metal pattern layer being formed in contact with the semiconductor substrate and having a height similar to the capacitor;

forming a second insulating layer over the semiconductor substrate, the first insulating layer, and the metal pattern layer; and planarizing the second insulating layer.

2. A method for manufacturing a semiconductor device as recited in claim 1, wherein the step of forming the first insulating layer further comprises the steps of forming an $O_3$-TEOS undoped silicate glass layer over the semiconductor substrate and the capacitor; and etching back the $O_3$-TEOS undoped silicate glass layer.

3. A method for manufacturing a semiconductor device as recited in claim 1, wherein the step of forming the first insulating layer further comprises the steps of:

forming an insulating layer including spin-on-glass over the semiconductor substrate and the capacitor; and etching back the insulating layer including spin-on-glass.

4. A method for manufacturing a semiconductor device as recited in claim 1, wherein the step of forming a first insulating layer comprises forming a reflowed BPSG layer.

5. A method for manufacturing a semiconductor device as recited in claim 1, wherein the step of planarizing the second insulating layer is performed by a CMP process.

6. A method for manufacturing a semiconductor device as recited in claim 1, wherein the second insulating layer comprises spin-on-glass, and wherein the step of planarizing the second insulating layer is performed by an etch back process.

7. A method for manufacturing a semiconductor device as recited in claim 1, further comprising the steps of:

forming a first contact hole in the first and second insulating layers to expose the semiconductor substrate in the memory cell region;

filling the first contact hole with a first conductive plug;

forming a second contact hole in the second insulating layer to expose the metal pattern layer in the logic region; and filling the second contact hole with a second conductive plug.

8. A method for manufacturing a semiconductor device as recited in claim 7, wherein the first and second conductive plugs comprise tungsten.

9. A method for manufacturing a semiconductor device as recited in claim 7, further comprising the steps of:

forming a first metal interconnection over the first conductive plug; and forming a second metal interconnection over the second conductive plug.

* * * * *